United States Patent [19]

Den Braber

[11] Patent Number: 5,287,073
[45] Date of Patent: Feb. 15, 1994

[54] PHASE LOCKED LOOP USING PILOT SIGNAL FOR LOCK DETECTION

[75] Inventor: Gerard P. Den Braber, Eindhoven, Netherlands

[73] Assignee: U.S. Philips Corporation, New York, N.Y.

[21] Appl. No.: 909,249

[22] Filed: Jul. 6, 1992

[30] Foreign Application Priority Data

Jul. 15, 1991 [EP] European Pat. Off. ............ 91201846

[51] Int. Cl.⁵ .............................................. H03L 7/095
[52] U.S. Cl. ........................................ 331/11; 331/25; 331/DIG. 2
[58] Field of Search ...................... 331/11, 25, DIG. 2

[56] References Cited

U.S. PATENT DOCUMENTS 4,316,154  2/1982  Krause ...................................... 331/4
4,866,402  9/1989  Black .................................. 331/1 A

*Primary Examiner*—Siegfried H. Grimm
*Attorney, Agent, or Firm*—Edward W. Goodman

[57] ABSTRACT

Arrangement including a phase-locked loop whose signal path incorporates a phase detector, a loop filter and a controlled oscillator, a pilot generator for generating a local auxiliary pilot which is applied to the controlled oscillator, and a pilot detector an input of which is coupled to the signal path of the loop and an output of which is coupled to a level detector via a filter member. In order to render an accurate and unambiguous locking indication possible in a simple manner, the frequency of the local auxiliary pilot is located within the passband of the loop and the pilot detector includes a synchronous detector having first and second inputs, the first input of which is coupled to the signal path of the loop between the phase detector and the controlled oscillator and the second input is coupled to the output of the pilot generator, an output of the synchronous detector being coupled to the low-pass filter.

4 Claims, 1 Drawing Sheet

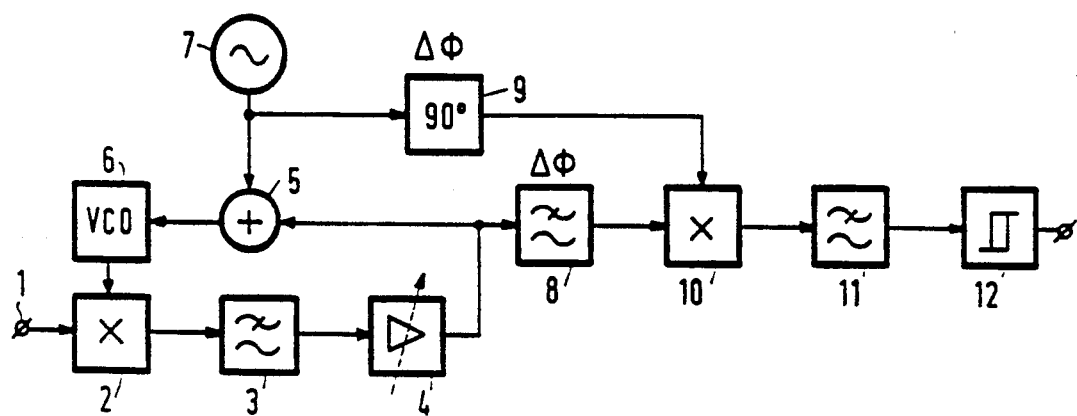

PHASE LOCKED LOOP USING PILOT SIGNAL FOR LOCK DETECTION

BACKGROUND OF THE INVENTION

1. Field of the Invention

The invention relates to an arrangement comprising a phase-locked loop, whose signal path incorporates a phase detector, a loop filter and a controlled oscillator, and a pilot generator for generating a local auxiliary pilot which is applied to the controlled oscillator, and a pilot detector an input of which is coupled to the signal path of the loop and an output of which is coupled to a level detector via a filter member.

2. Description of the Related Art

An arrangement of this type is known per se from Japanese Patent publication Kokai 63-107304 and supplies a binary output signal which gives an indication about the state of phase lock of the phase-locked loop.

In the phase-locked state of the loop, the output signal of the controlled oscillator is frequency-modulated with the local auxiliary pilot. In the known arrangement, this frequency-modulated oscillator signal is applied to a frequency discriminator operating as a pilot detector. To this end, an input of the known pilot detector is coupled to the signal path between the output of the controlled oscillator and an input of the phase detector. The auxiliary pilot demodulated by the frequency discriminator is applied to the level detector via a band-pass selection in the filter member. The level detector supplies the above-mentioned binary output signal which has the value of 0 or 1 with respect to a given threshold value in dependence upon the amplitude of the auxiliary pilot selected by means of the filter member.

In the phase-locked state of the loop, the oscillator frequency corresponds to the frequency to which the frequency discriminator is tuned, i.e. the zero frequency, and the frequency-modulated oscillator frequency varies within the detection range of the frequency discriminator. The frequency discriminator then supplies the local auxiliary pilot at an amplitude which exceeds said threshold value and thus gives rise to a given output signal value of the level detector, for example 1.

Outside the locking range, the oscillator frequency deviates from said zero frequency to such an extent that it does not coincide with the detection range of the frequency discriminator and that the auxiliary pilot cannot be detected. Consequently, the frequency discriminator supplies no or substantially no signal component at the frequency of the auxiliary pilot so that the output signal of the bandpass filter member remains below said threshold value and the level detector supplies the output signal value of 0. For a correct locking indication, the dimensioning of the frequency discriminator and hence the location, the steepness and the range of the detection curve, as well as said threshold value of the level detector should be accurately set to correct values with respect to the locking range of the phase-locked loop. The circuit settings required for this purpose are complex and time-consuming, hence costly.

SUMAMRY OF THE INVENTION

It is an object of the invention to provide an arrangement including a phase-locked loop giving a locking indication of the type described in the opening paragraph, which can be realized at a lower cost and provides the possibility of a more accurate locking indication than said known arrangement.

According to the invention, such an arrangement is therefore characterized in that the pilot detector is tuned to the frequency of the auxiliary pilot and has a first input which is coupled to the signal path of the loop between the phase detector and the controlled oscillator, and an output which is coupled to the filter member, said filter member comprising a low-pass filter.

The invention utilizes the aspect that loop parameters, such as bandwidth, phase shift and loop gain in the phase-locked state of the loop, clearly deviate from those outside the phase-locked state.

It is based on the recognition that the phase detector supplies a mixing product when the oscillator signal, which is frequency or phase-modulated with the local auxiliary pilot of the signal generator, is phase-locked with an input carrier, which mixing product has a frequency which is equal to that of the last-mentioned original auxiliary pilot, and an amplitude and phase shift with respect to this original auxiliary pilot which are characteristic of the state of phase lock.

When the measure according to the invention is used, this recognition is utilized by comparing the amplitude and/or phase of said mixing product, also referred to as return pilot, in the output signal of the phase detector with the original local auxiliary pilot supplied by the pilot generator.

Since the amplitude and/or phase of the return pilot in the phase-locked state of the loop deviates considerably from that outside the locking range, the threshold value of the level detector may vary within a comparatively large tolerance range without influencing the accuracy and uniformity of the locking indication obtained in accordance with the invention. In contrast to said known arrangement, frequency demodulation is not necessary for this purpose and a simple amplitude or phase detector can be used as a pilot detector and a simple low-pass filter can be used as a filter member.

A preferred embodiment of an arrangement according to the invention is characterized in that the pilot generator is coupled to a second input of the pilot detector, which pilot detector comprises a multiplier circuit for synchronous detection of the auxiliary pilot, an output of the multiplier circuit being coupled to the low-pass filter. When this measure is used, the accuracy of detecting amplitude and/or phase variations of the return pilot with respect to the original auxiliary pilot can be enhanced.

To be able to adjust the synchronous detection at an optimum working point, a further preferred embodiment of the arrangement according to the invention is characterized in that a first phase-shifting circuit precedes one of the two first and second inputs of the pilot detector.

For an effective locking indication the quantity (amplitude or phase) of the return pilot, which varies to the greatest extent at the transition from the phase-locked state to the unlocked state, and conversely, should be detected. A synchronous amplitude detection of the return pilot is preferably effected and the frequency of the local auxiliary pilot is chosen within said 3 dB loop passband.

A further preferred embodiment is therefore characterized in that the frequency of the local auxiliary pilot is located within the passband of the loop, the first phase-shifting circuit precedes the first input of the pilot detector and a second phase-shifting circuit is arranged between the signal generator and the second input of the pilot detector for a 90° phase shift of the local auxiliary pilot, the output signal of the first phase-shifting circuit being substantially in phase or in anti-phase at the frequency of the local auxiliary pilot with respect to the local auxiliary pilot at the output of the second phase-shifting circuit for a substantially synchronous amplitude detection of the local auxiliary pilot supplied by the first phase-shifting circuit.

When this measure is used, an optimum synchronous amplitude detection of the return pilot is realized.

BRIEF DESCRIPTION OF THE DRAWING

The invention will be described in greater detail with reference to the sole FIGURE shown in the drawing.

DESCRIPTION OF THE PREFERRED EMBODIMENT

The FIGURE shows an arrangement comprising a phase-locked loop 2 to 6 and a pilot detection device 8 to 10, a low-pass filter member 11, a level detector 12 and a signal generator 7 for generating a local auxiliary pilot. The phase-locked loop 2 to 6 has a signal input 1 to which a modulated or unmodulated RF or IF input signal is applied. The signal input 1 is coupled to a phase detector 2, a loop filter 3, an amplifier 4, an adder stage 5 and a controlled oscillator 6. In the phase-locked state of the loop, phase differences deviating from 90° between the oscillator signal from the controlled oscillator 6 applied to the phase detector 2, on the one hand, and the carrier of the input signal applied to the input 1, on the other hand, are negatively fed back in the loop. This results in a frequency and phase synchronization of said oscillator signal with the carrier of the input signal. If the loop is outside its locking range, the oscillator frequency deviates from the frequency of the input carrier by a value which is larger than the capture range of the loop.

The local auxiliary pilot supplied by the signal generator 7, also referred to as the original auxiliary pilot, is injected in the signal path of the loop preceding the controlled oscillator 6 by adding this original auxiliary pilot to the loop signal in the adder stage 5 arranged between the amplifier 4 and the controlled oscillator 6. As a result, the oscillator signal is modulated in frequency or phase with the auxiliary pilot (also referred to as angle modulation). In the phase-locked state of the loop, a mixing product is formed in the phase detector 2 at a frequency which is equal to the frequency of the local auxiliary pilot and at an amplitude and phase which are characteristic of the amplitude and phase transfer of the controlled oscillator 6 and the phase detector 2 in this state of phase lock. This mixing product, also referred to as return pilot, is applied to an input of the pilot detection device 8 to 10 via the loop filter 3 and the amplifier 4.

The pilot detection device 8 to 10 has first and second phase-shifting circuits 8 and 9 via which the amplifier 4 and the signal generator 7, respectively, are coupled to first and second inputs of a multiplier circuit 10 operating as a pilot detector. The return pilot is applied from the controlled amplifier 4 to the last-mentioned first input of the pilot detector 10 via the first phase-shifting circuit 8, and the original auxiliary pilot is applied to the second input of the pilot detector 10 via the second phase-shifting circuit 9. The second phase-shifting circuit 9 realizes a 90° phase shift of the original auxiliary pilot. An output of the multiplier circuit 10 is coupled to a level detector 12 via the low-pass filter member 11. In the phase-locked state of the loop, the auxiliary pilot undergoes a phase shift from the input of the adder circuit 5 to the output of the amplifier 4, which phase shift is dependent on the phase transfer of the loop at the frequency of the local auxiliary pilot.

In the embodiment shown, a synchronous amplitude detection of the return pilot is realized by causing the two pilot signals applied to the multiplier circuit 10 to be mutually in phase or in anti-phase. To this end, the original auxiliary pilot is shifted 90° in phase in the second phase-shifting circuit 9 before it is applied to said second input of the pilot detector 10 and the phase shift realized in the first phase-shifting circuit 8 is chosen to be such that, together with the phase shift occurring in the loop at the auxiliary pilot frequency, it is either equal to the phase of the auxiliary pilot applied to the second input of the synchronous detector 9, or differs 180° therefrom.

The amplitude of the return pilot becomes available in the form of a dc component at the output of the pilot detector 10 and is applied to the level detector 12 after low-pass selection in the low-pass filter member 11. The level detector 12 has a threshold value which is chosen to be such that it is exceeded by said dc component in the phase-locked state of the loop. In that case, the level detector 12 supplies a locking indication signal having a given binary value, for example 1, which can be further used (not shown) for adjusting, for example, the loop gain to a given value or for indicating the state of phase lock.

Outside the locking range, the amplitude of the return pilot is zero or substantially zero so that no dc component exceeding the last-mentioned threshold value of the level detector 12 is obtained at the output of the pilot detection device 8–10. The level detector then supplies a locking indication signal having the other binary value, i.e. 0 in this case.

In a practical embodiment, the loop bandwidth was 75 kHz, the auxiliary pilot was 38 kHz and the bandwidth of the low-pass filter was 50 Hz. A Schmitt trigger was used as a level detection circuit.

It will be evident that the inventive idea is applicable in an embodiment which differs from the embodiment shown. For example, the amplifier 4 and one of the two said phase-shifting circuits or both phase-shifting circuits may be dispensed with, a peak detector or a phase detector may be used instead of the synchronous detector 10 and the frequency of the local auxiliary pilot may be chosen outside the 3 dB loop passband.

I claim:

1. An arrangement comprising a phase-locked loop having a signal path incorporating a phase detector, a loop filter and a controlled oscillator, a pilot generator for generating a local auxiliary pilot which is applied to the controlled oscillator, and a pilot detector having an input coupled to the signal path of the loop and an output coupled to a level detector via a filter member, characterized in that the pilot detector is tuned to the frequency of the auxiliary pilot and has a first input coupled to the signal path of the loop between the phase detector and the controlled oscillator, and an output coupled to the filter member, said filter member comprising a low-pass filter, and said arrangement further comprises a controlled loop amplifier incorporated in said signal path, said controlled loop amplifier having an output coupled to the first input of the pilot detector and to an input of the controlled oscillator via an adder stage, an input of said adder stage being coupled to an output of the pilot generator.

2. An arrangement comprising a phase-locked loop as claimed in claim 1, characterized in that the pilot generator is coupled to a second input of the pilot detector, the pilot detector comprising a multiplier circuit for synchronous detection of the auxiliary pilot, an output of the multiplier circuit being coupled to the low-pass filter.

3. An arrangement comprising a phase-locked loop having a signal path incorporating a phase detector, a loop filter and a controlled oscillator, a pilot generator for generating a local auxiliary pilot which is applied to the controlled oscillator, and a pilot detector tuned to the frequency of the auxiliary pilot, said pilot detector having a first input coupled to the signal path of the loop between the phase detector and the controlled oscillator, a second input coupled to the pilot generator, and an output coupled to a level detector via a filter member, said filter member comprising a low-pass filter, wherein the pilot detector comprises a multiplier circuit for synchronous detection of the auxiliary pilot, an output of the multiplier circuit being coupled to the low-pass filter, characterized in that a first phase-shifting circuit precedes one of the two first and second inputs of the pilot detector.

4. An arrangement comprising a phase-locked loop as claimed in claim 3, characterized in that the frequency of the local auxiliary pilot is located within the passband of the loop, the first phase-shifting circuit precedes the first input of the pilot detector and a second phase-shifting circuit is arranged between the signal generator and the second input of the pilot detector for a 90° phase shift of the local auxiliary pilot, the output signal of the first phase-shifting circuit being substantially in phase or in anti-phase at the frequency of the local auxiliary pilot with respect to the local auxiliary pilot at the output of the second phase-shifting circuit for a substantially synchronous amplitude detection of the local auxiliary pilot supplied by the first phase-shifting circuit.

* * * * *